(12) United States Patent
Lee et al.

(10) Patent No.: US 9,093,537 B2
(45) Date of Patent: Jul. 28, 2015

(54) DISPLAY DEVICE AND METHOD FOR MANUFACTURING THE SAME

(71) Applicant: LG DISPLAY CO., LTD., Seoul (KR)

(72) Inventors: Dongho Lee, Pyeongtaek-si (KR); Soonjae Hwang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 175 days.

(21) Appl. No.: 13/718,728

(22) Filed: Dec. 18, 2012

(65) Prior Publication Data

US 2013/0161631 A1    Jun. 27, 2013

(30) Foreign Application Priority Data

Dec. 21, 2011  (KR) .................. 10-2011-0139534
Nov. 23, 2012  (KR) .................. 10-2012-0134055

(51) Int. Cl.
| | | |
|---|---|---|
| H01L 27/00 | (2006.01) | |
| H01L 29/786 | (2006.01) | |
| H01L 27/12 | (2006.01) | |
| H01L 27/32 | (2006.01) | |
| H01L 29/49 | (2006.01) | |
| H01L 29/66 | (2006.01) | |

(52) U.S. Cl.
CPC ........ *H01L 29/78609* (2013.01); *H01L 27/124* (2013.01); *H01L 27/1214* (2013.01); *H01L 27/1248* (2013.01); *H01L 27/3244* (2013.01); *H01L 27/3262* (2013.01); *H01L 29/4908* (2013.01); *H01L 29/66765* (2013.01); *H01L 27/322* (2013.01)

(58) Field of Classification Search
CPC ............... H01L 29/66765; H01L 27/1214; H01L 29/4908; H01L 27/1248; H01L 27/3262; H01L 27/3244
See application file for complete search history.

(56) References Cited

U.S. PATENT DOCUMENTS

| | | | |
|---|---|---|---|
| 5,920,083 A | 7/1999 | Bae | |
| 2004/0046902 A1 | 3/2004 | Yamasaki | |
| 2005/0001943 A1 | 1/2005 | Kim et al. | |
| 2005/0174503 A1 | 8/2005 | Kim et al. | |
| 2009/0219478 A1* | 9/2009 | Park et al. | ..... 349/155 |
| 2010/0171105 A1* | 7/2010 | Kim et al. | ..... 257/40 |
| 2010/0171416 A1* | 7/2010 | Lee | ..... 313/504 |
| 2011/0193076 A1* | 8/2011 | Yun et al. | ..... 257/43 |

FOREIGN PATENT DOCUMENTS

| | | |
|---|---|---|
| EP | 0 750 350 A2 | 12/1996 |
| EP | 1 058 310 A2 | 12/2000 |
| EP | 1 801 640 A1 | 6/2007 |
| JP | 2005-215278 A | 8/2005 |
| KR | 10-0194679 B1 | 7/1999 |

* cited by examiner

*Primary Examiner* — Ngan Ngo
(74) *Attorney, Agent, or Firm* — Birch, Stewart, Kolasch & Birch, LLP

(57) ABSTRACT

A display device and method for manufacturing the same are discussed. The display device according to an embodiment includes a substrate, a gate metal line disposed on the substrate, a gate insulating film configured to insulate the gate metal line, a data metal line disposed on the gate insulating film, and a protection film disposed at an area where the gate metal line and the data metal line overlap each other between the gate metal line and the data metal line.

17 Claims, 10 Drawing Sheets

DISPLAY DEVICE AND METHOD FOR MANUFACTURING THE SAME

This application claims the priority benefit of Korean Patent Application Nos. 10-2011-0139534 filed on Dec. 21, 2011 and 10-2012-0134055 filed on Nov. 23, 2012, which are all incorporated herein by reference for all purposes as if fully set forth herein.

BACKGROUND OF INVENTION

1. Field of the Invention

This document relates to a display device that may prevent a short circuit from occurring between lines and a method of manufacturing the same.

2. Discussion of the Related Art

Recently, various flat type displays are being developed that may reduce the weight and volume which is a shortcoming of CRTs (Cathode Ray Tubes). Examples of such flat type displays are LCD (Liquid Crystal Displays), FEDs (Field Emission Displays), PDPs (Plasma Display Panels), and OLEDs (Organic Light Emitting Displays).

Among them, OLEDs are self-emission displays that emit light by electrically exciting an organic compound. OLEDs do not require a backlight that is used for LCDs, and thus, may be made light and thin while simplifying a process. Further, OLEDs may be manufactured at a low temperature, and provide high response speed that is 1 ms or less, together with low power consumption, broad view angle, and high contrast.

An OLED includes a light emission layer formed of an organic material between an anode electrode and a cathode electrode. Holes supplied from the anode electrode and electrons supplied from the cathode electrode are combined to each other in the light emission layer to thereby form excitons that are hole-electron pairs. The excitons generate energy when transiting back to the ground state, thereby radiating light.

FIG. 1 is a plan view illustrating an organic light emitting display according to the prior art, FIG. 2 is a plan view illustrating an organic light emitting display that has scratches thereon, and FIG. 3 is a cross-sectional view illustrating a power unit of an organic light emitting display.

Referring to FIG. 1, the conventional organic light emitting display includes an active area A/A and a data line 25 and a gate line 35 near the active area A/A. An image is displayed on the active area A/A. A data signal coming from a data IC 20 is transmitted through the data line 25, and a gate signal coming from a gate IC 30 is transmitted through the gate line 35. The data line 25 crosses the gate line 35. A data power line 40 parallel to the data line 25 and a gate power line 45 parallel to the gate line 35 constitute a power unit 45.

Here, when viewed from a cross section of the power unit 45 where the gate power line 45 and the data power line 40 cross each other, the gate power line 45 is disposed on the substrate 10, a gate insulating film 37 is disposed on the gate power line 45, and the data power line 40 is disposed on the gate insulating film 37.

However, as shown in FIG. 2, cuts or scratches sometimes occur on the power unit 45 while a subsequent process of the organic light emitting display is performed. Accordingly, as shown in FIG. 3, the data power line 40 may pass through the gate insulating film 37 to thereby contact the gate power line 45, which may cause power to be not applied to the panel.

SUMMARY OF THE INVENTION

The present invention relates to a display device that may prevent a short circuit from occurring between lines and a method of manufacturing the same.

In one aspect, there is a display device including a substrate, a gate metal line disposed on the substrate, a gate insulating film configured to insulate the gate metal line, a data metal line disposed on the gate insulating film, and a protection film disposed at an area where the gate metal line and the data metal line overlap each other between the gate metal line and the data metal line.

In another aspect, there is a display device including a substrate, a gate metal line disposed on the substrate, a gate insulating film configured to insulate the gate metal line, a data metal line disposed on the gate insulating film, a passivation film disposed on the data metal line, a pixel electrode disposed on the passivation film, and a protection film disposed at an area where the data metal line and the pixel electrode overlap each other between the data metal line and the pixel electrode.

In another aspect, there is a method of manufacturing a display device, the method including forming a gate metal line on a substrate, forming a protection film on the gate metal line, forming a gate insulating film on the protection film, and forming a data metal line on the gate insulating film, wherein the protection film is formed at an area where the gate metal line and the data metal line overlap each other.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
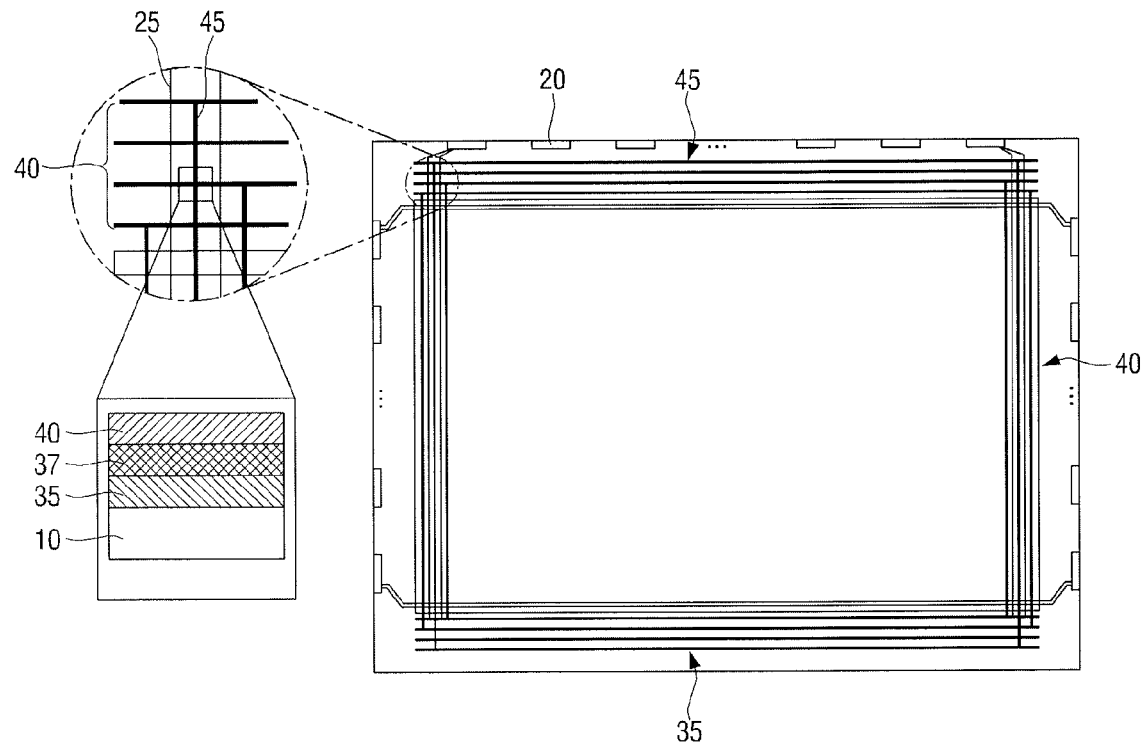
FIG. 1 is a plan view illustrating an organic light emission display according to the prior art.
Figure 2:
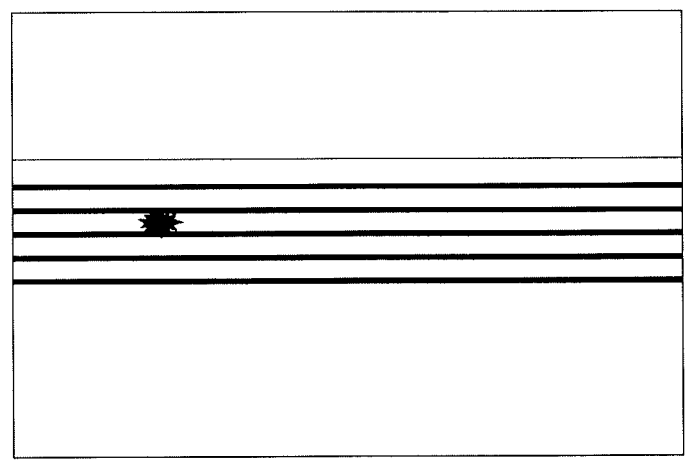
FIG. 2 is a plan view illustrating an organic light emission display on which scratches are created.
Figure 3:
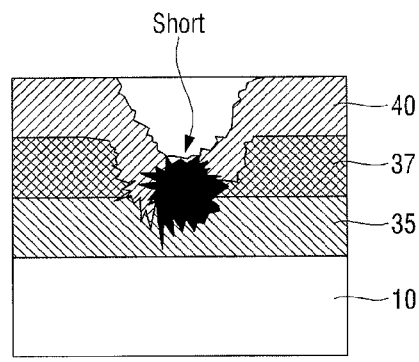
FIG. 3 is a cross-sectional view illustrating a power unit of an organic light emission display.
Figure 4:
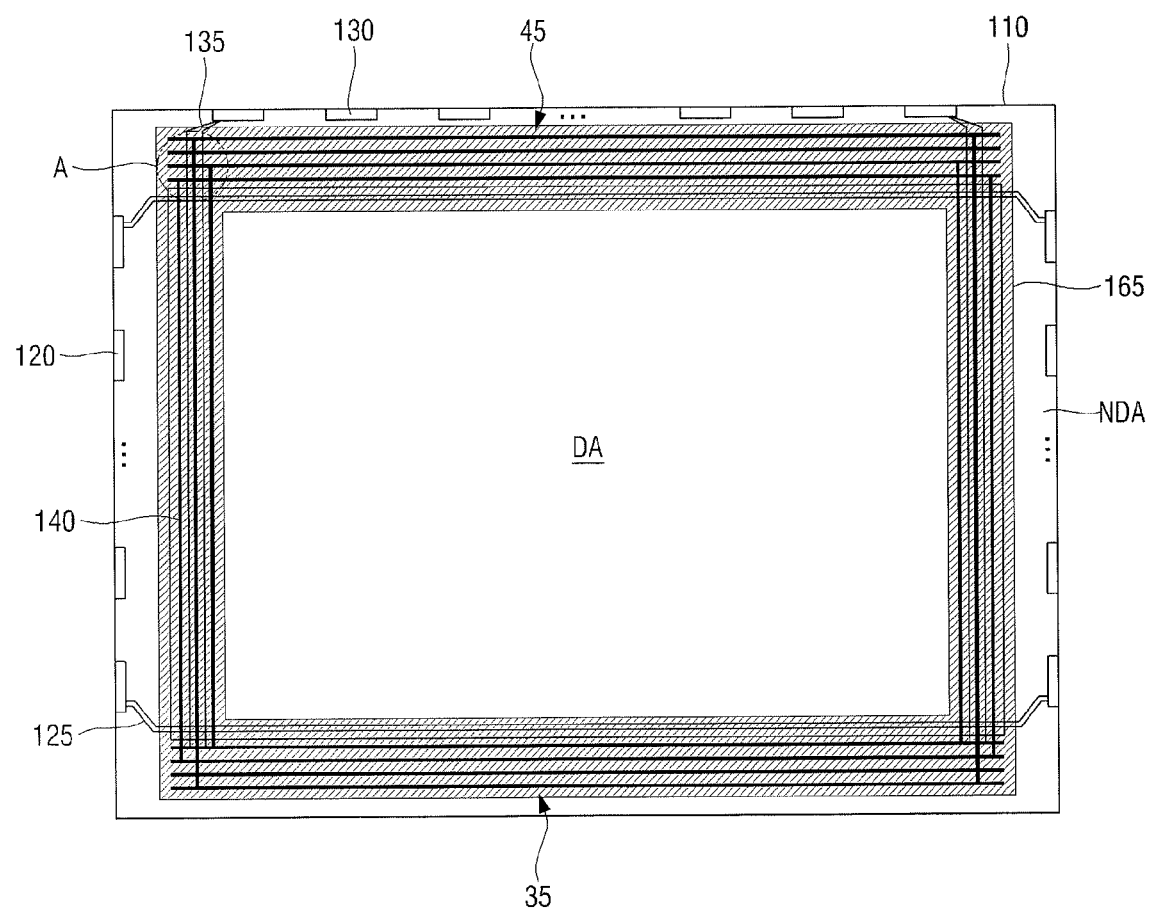
FIG. 4 is a plan view illustrating a display device according to an embodiment of the present invention.
Figure 5:
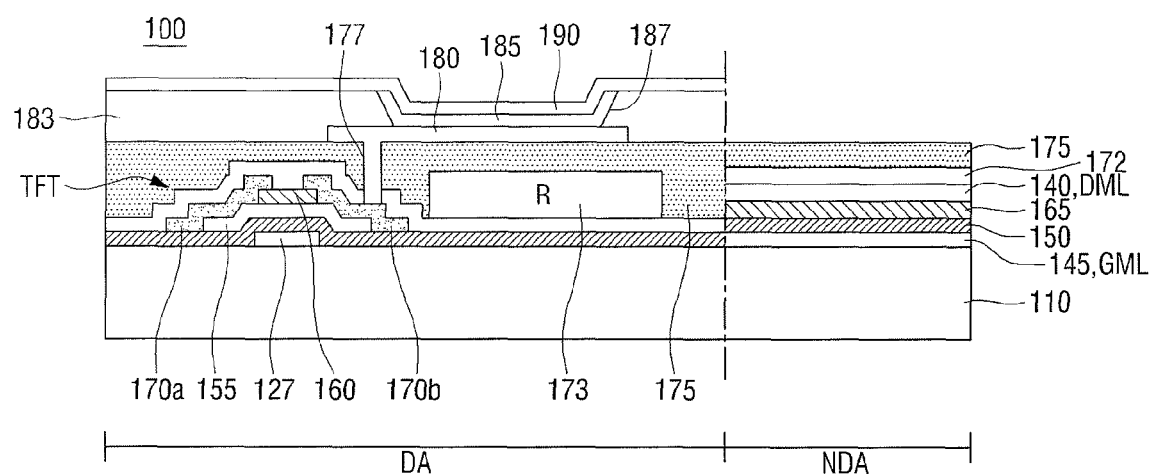
FIG. 5 is a cross-sectional view illustrating a display device according to an embodiment of the present invention.

FIG. 4 is a plan view illustrating a display device according to a first embodiment of the present invention, and FIG. 5 is a cross-sectional view illustrating a display device according to a first embodiment of the present invention. Hereinafter, the display device according to the present invention is described as being, as an example, an organic light emitting display. However, the present invention is not limited thereto.

Referring to FIG. 4, the display device according to a first embodiment of the present invention includes a gate IC 120 for applying a gate signal and a data IC 130 for applying a data signal on a substrate 110. A gate line 125 which a gate signal is transmitted from the gate IC 120 is arranged in a direction on the substrate 110, and a data line 135 which a data signal is transmitted from a data IC 130 is transmitted is arranged in a direction of crossing the gate line 125.

The gate line 125 and the data line 135 cross each other thereby defining a display area DA where an image is displayed, and the remaining area other than the display area DA is defined as a non display area NDA. Power lines are arranged on the non display area NDA to apply power to the active area DA. The power lines include a vertical power line 140 parallel to the data line 135 and a horizontal power line 145 parallel to the gate line 125. An area where the vertical power line 140 crosses the horizontal power line 145 is constituted as a power unit A. The horizontal power line 145 and the gate line 125 are formed of the same gate metal, thereby constituting a gate metal line GML, and the vertical power line 140 and the data line 135 are formed of the same data metal, thereby constituting a data metal line DML.

Meanwhile, a protection film 165 is formed between the gate metal line GML and the data metal line DML at an area where the gate metal line GML and the data metal line DML cross and overlap each other. The protection film 165 prevents the gate metal line GML and the data metal line DML from contacting each other and causing a short circuit by an external impact.

Hereinafter, the first embodiment of the present invention is described in greater detail with reference to FIG. 5. FIG. 5 is a cross-sectional view illustrating a display area and a non display area of the display device of FIG. 4.

Referring to FIG. 5, the display device 100 according to the first embodiment of the present invention includes a substrate 110 that defines a display area DA and a non display area NDA. A gate electrode 127 is disposed on the display area DA of the substrate 110, and a gate insulating film 150 is disposed on the gate electrode 127 to insulate the gate electrode 127. A semiconductor layer 155 is disposed on the gate insulating film 150 at an area corresponding to the gate electrode 127, and an etch stopper 160 is disposed on the semiconductor layer 155. A source electrode 170*a* and a drain electrode 170*b* are respectively positioned to be connected to both ends of the semiconductor layer 155, thereby constituting a thin film transistor TFT.

A passivation film 172 is disposed to protect the thin film transistor TFT, and a color filter 173 is disposed on the passivation film 172. The color filter 173 is formed on the passivation film 172 to correspond to a first electrode 180 to be described later, so that white light emitted from a light emission layer 185 later is later transmitted through the color filter 173 by passing through the first electrode 180. The color filter 173 may display at least one of red, green, and blue, and in this embodiment, is described as being a red color filter layer.

An overcoat layer 175 is disposed to cover the color filter 173, and the first electrode 180 is disposed on the overcoat layer 175. The first electrode 180 is connected to the drain electrode 170*b* of the thin film transistor TFT through a via hole 177. A bank layer 183 is disposed on the first electrode 180 to expose part of the first electrode 180, and the light emission layer 185 is disposed on the exposed first electrode 180. A second electrode 190 is disposed on the light emission layer 185.

Meanwhile, a horizontal power line 145 is disposed on the non display area NDA of the substrate 110, a gate insulating film 150 is disposed on the horizontal power line 145 to insulate the horizontal power line 145. A protection film 165 is disposed on the gate insulating film 150, and the vertical power line 140 is disposed on the protection film 165. An overcoat layer 175 is disposed on the vertical power line 140.

As such, the display device according to the first embodiment of the present invention further includes the protection film 165 between the horizontal power line 145 and the vertical power line 140 on the non display area.

Hereinafter, a method of manufacturing a display device according to a first embodiment of the present invention is described. FIGS. 6*a* to 6*d* are cross-sectional views respectively illustrating processes of a method of manufacturing a display device according to a first embodiment of the present invention, and FIG. 7 is a plan view illustrating another position of a protection film of a display device according to a first embodiment of the present invention.

Figure 6A:
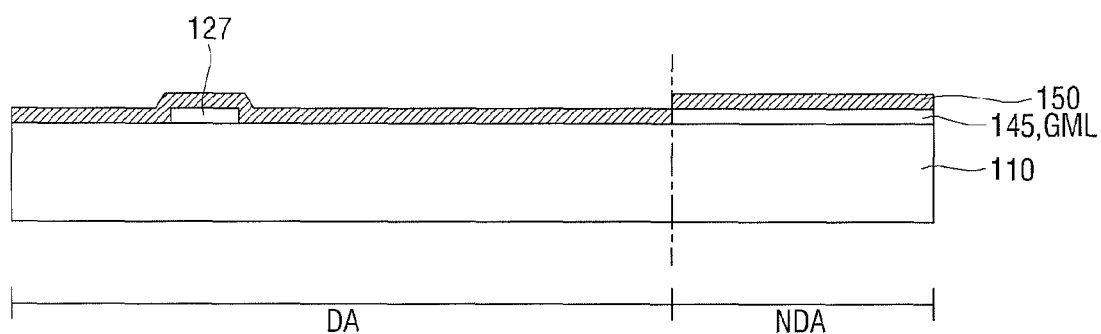
FIGS. 6a to 6d are cross-sectional views respectively illustrating processes of a method of manufacturing a display device according to an embodiment of the present invention.
Figure 7:
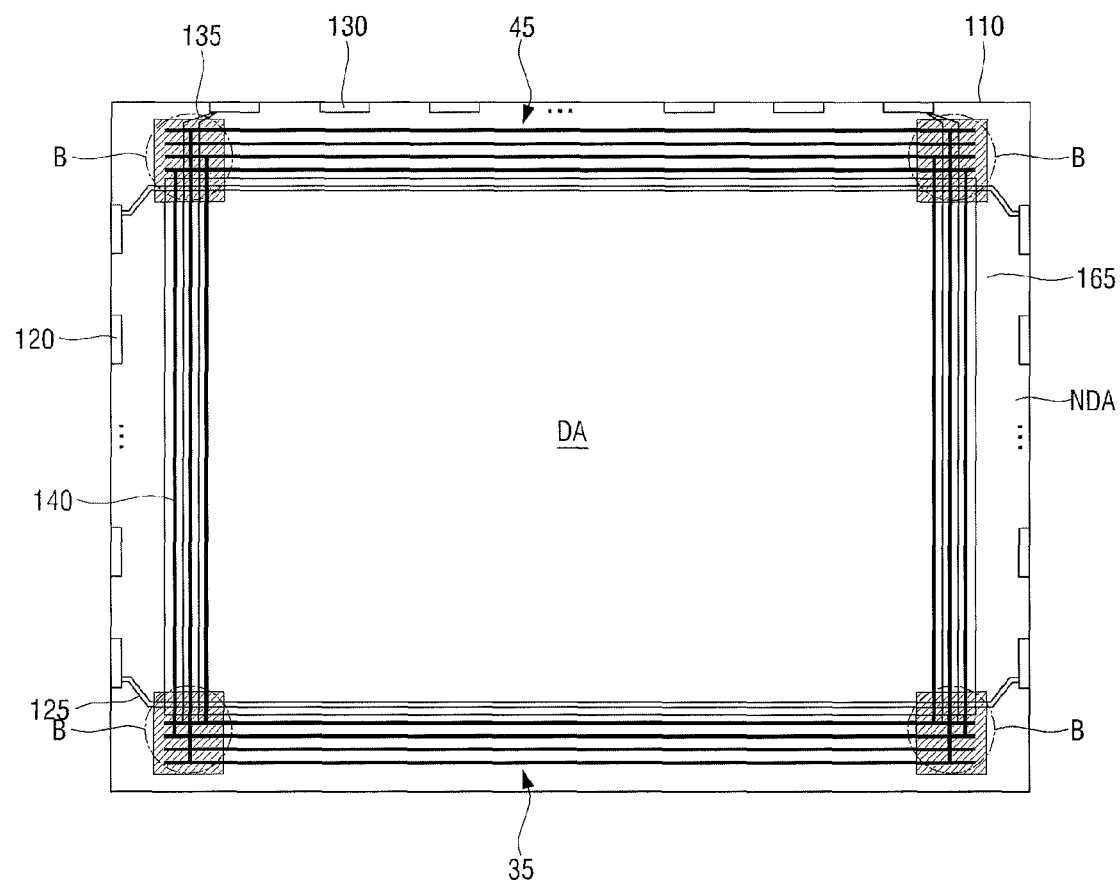
FIG. 7 is a plan view illustrating another position of a protection film of a display device according to a first embodiment of the present invention.

Referring to FIG. 6*a*, a first metal is first deposited on a substrate 110 made of glass, plastic or a conductive material, and patterned to thereby form a gate electrode 127 on a display area DA and a horizontal power line 145 on a non display area NDA. Although not shown in the drawings, a gate line is simultaneously formed. The first metal may be a low-resistance metal, such as molybdenum (Mo), aluminum (Al), chrome (Cr), gold (Au), titanium (Ti), nickel (Ni), copper (Cu) or an alloy thereof.

Then, a gate insulating film 150 is formed on the substrate 110 on which the gate electrode 127 and the horizontal power line 145 are formed. The gate insulating film 150 may be formed of a silicon oxide (SiOx), a silicon nitride (SiNx) or a stacking structure thereof. The gate insulating film 150 is formed on both the display area (DA) and non display area NDA of the substrate 110.

Figure 6B:
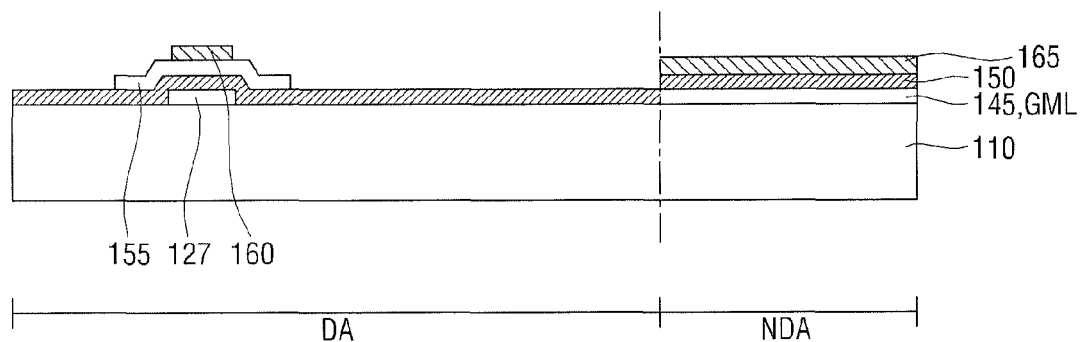

Next, Referring to FIG. 6*b*, amorphous silicon is deposited on the substrate 110 on which the gate insulating film 150 is formed, and crystallized to thereby form polysilicon, and is then patterned to form a semiconductor layer 155. Thereafter, a silicon oxide (SiOx) or silicon nitride (SiNx) is deposited on the whole surface of the substrate 110 including the semiconductor layer 155 and patterned to thereby form an etch stopper 160 and a protection film 165. More specifically, the etch stopper 160 is formed on the semiconductor layer 155 on the display area DA of the substrate 110, and the protection film 165 is formed on the non display area NDA.

Referring back to FIG. 4, the protection film 165 on the non display area NDA is formed to surround the display area DA, and is formed to overlap an area where a data line 135, a gate line 125, a horizontal power line 145, and a vertical power line 140 are arranged. In contrast, Referring to FIG. 7, the protection film 165 may be formed on an area B where at least the horizontal power line 145 and the vertical power line 140 or the gate line 125 and the data line 135 cross each other.

That is, the protection film 165 is formed at an area where a gate metal line GML including the gate line 125 and the horizontal power line 145 crosses and overlaps a data metal line DML including the data line 135 and the vertical power line 140. Accordingly, the gate metal line GML and the data metal line DML are prevented from contacting each other, thereby causing a short circuit, due to physical damage while the processes are conducted.

Figure 6C:
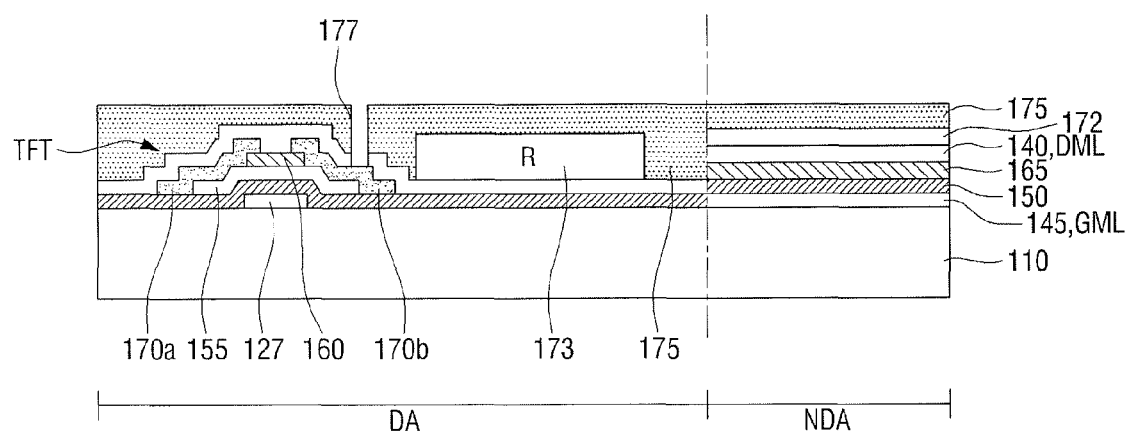

Referring to FIG. 6c, a second metal is then deposited on the substrate 110 on which the etch stopper 160 and the protection film 165 are formed and patterned to thereby form a source electrode 170a and a drain electrode 170b on the display area DA and a vertical power line 140 on the non display area NDA. Although not shown in the drawings, a data line is simultaneously formed. The second metal may be a low-resistance metal, such as molybdenum (Mo), aluminum (Al), chrome (Cr), gold (Au), titanium (Ti), nickel (Ni), copper (Cu), or an alloy thereof, and may be formed of a single layer of the low-resistance material or a multi-layer of molybdenum/aluminum//molybdenum (Mo/Al/Mo) or titanium/aluminum/titanium (Ti/Al/Ti).

Next, a passivation film 172 is formed on the substrate 110 on which the source electrode 170a, drain electrode 170b, and vertical power line 140 are formed. The passivation film 172 may be formed of a silicon oxide (SiOx), a silicon nitride (SiNx) or a stacking structure thereof. The passivation film 172 is formed on both the display area DA and the non display area NDA of the substrate 110.

Subsequently, a color filter 173 is formed on the passivation film 172 of the display area DA. The color filter 173 is formed at a position corresponding to a light emission layer 185 which is to be described below, so that white light coming from the light emission layer 185 is radiated as red, green, or blue light through the color filter 173.

Next, an overcoat layer 175 is formed on the entire surface of the substrate 110 on which the color filter 173 is formed. The overcoat layer 175 mitigates a step of a lower structure, and may be formed by using an inorganic material, such as SOG (Spin On Glass) that is obtained by coating, in the liquid phase, a silicon oxide or an organic material, such as polyimide, benzocyclobutene series resin or acrylate and then curing it. Thereafter, the overcoat layer 175 is etched to form a via hole 177 that exposes one of the source electrode 170a and the drain electrode 170b.

Figure 6D:
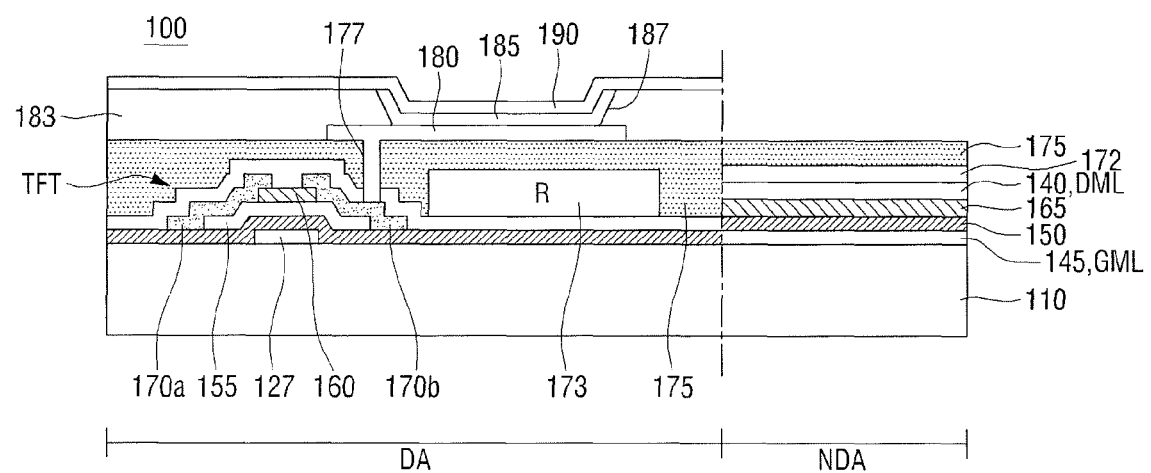

Subsequently, Referring to FIG. 6d, a first electrode 180 is formed that is connected via the via hole 177 to one of the source electrode 170a and the drain electrode 170b. The first electrode 180 may be formed of a transparent conductive film, such as ITO (Indium Tin Oxide) or IZO (Indium Zinc Oxide).

Then, a bank layer 183 is formed on the first electrode 180 to insulate the first electrode 180 from another first electrode. The bank layer 183 may be formed of an organic material, such as polyimide, benzocyclobutene series resin or acrylate. Thereafter, the bank layer 183 is etched to form an opening 187 that exposes part of the first electrode 180.

Next, a light emission layer 185 is formed in the opening 187 that exposes the first electrode 180. The light emission layer 185 is formed of an organic material that emits white light and so may radiate white light. The light emission layer 185 is formed on the first electrode 180 with respect to all subpixels. Accordingly, white light emitted from the light emission layer 185 may be realized into red, green, and blue through the color filter 173.

Further, one or more of an electron injection layer (EIL) and an electron transportation layer (ETL) may be further provided between the light emission layer 185 and the first electrode 180 to allow electrons to be readily moved to the light emission layer 185. One or more of a hole injection layer (HIL) and a hole transportation layer (HTL) may be further provided between the light emission layer 185 and the second electrode 190 to allow holes to be readily moved to the light emission layer 185. The light emission layer 185 may be formed by using a vacuum deposition, laser-induced thermal imaging, screen printing, and inkjet process.

Thereafter, a second electrode 190 is formed on the substrate 110 including the light emission layer 185. The second electrode 190 may use a low-work function metal, such as silver (Ag), magnesium (Mg) or calcium (Ca).

As described above, in the display device according to the first embodiment of the present invention, a protection film is formed between the gate metal line and the data metal line while the etch stopper of the thin film transistor is simultaneously formed, so that the gate metal line and the data metal line may be prevented from contacting each other to thereby cause a short circuit due to physical damage that may occur during the processes.

Figure 8:
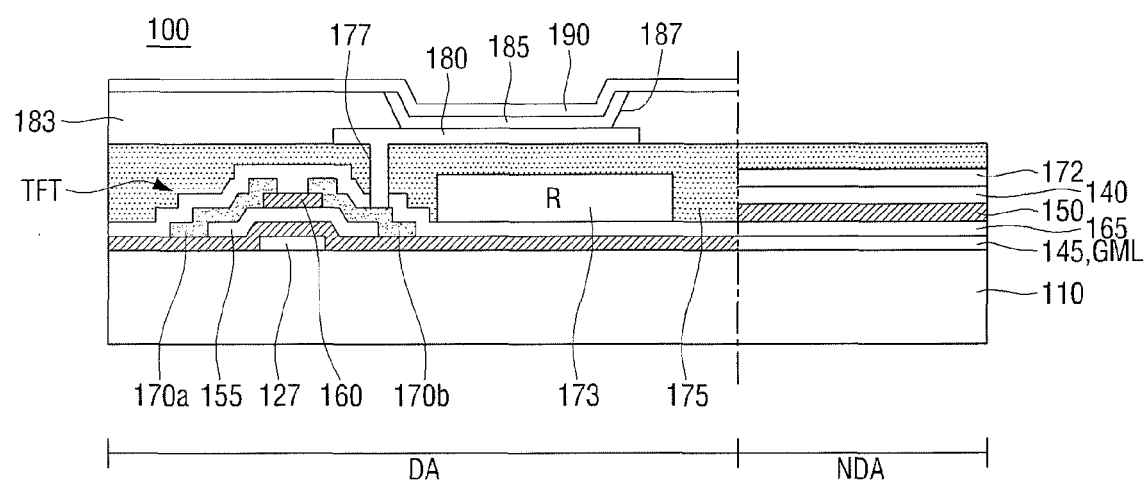
FIG. 8 is a cross-sectional view illustrating a display device according to a second embodiment of the present invention.

Meanwhile, the protection film 165 according to the present invention may be formed between the gate insulating film 150 and the horizontal power line 145. FIG. 8 is a cross-sectional view illustrating a display device according to a second embodiment of the present invention. Hereinafter, the detailed description of the same components as those described above in connection with the first embodiment is skipped.

Referring to FIG. 8, the display device 100 according to the second embodiment of the present invention includes a gate electrode 127 on a display area DA of the substrate 110 and a gate insulating film 150 on the gate electrode 127 to insulate the gate electrode 127. A semiconductor layer 155 is disposed on the gate insulating film 150 at an area corresponding to the gate electrode 127, and an etch stopper 160 is disposed on the semiconductor layer 155. A source electrode 170a and a drain electrode 170b are disposed to be connected to both ends, respectively, of the semiconductor layer 155, thereby constituting a thin film transistor TFT.

A passivation film 172 is disposed to protect the thin film transistor TFT, and a color filter 173 is disposed on the passivation film 172. An overcoat layer 175 is disposed to cover the color filter 173, and a first electrode 180 is disposed on the overcoat layer 175. The first electrode 180 is connected to the drain electrode 170b of the thin film transistor TFT through a via hole 177. A bank layer 183 is disposed on the first electrode 180 to expose part of the first electrode 180, and a light emission layer 185 is disposed on the exposed first electrode 180. A second electrode 190 is disposed on the light emission layer 185.

Meanwhile, a horizontal power line 145 is disposed on the non display area NDA of the substrate 110. A protection film 165 is disposed on the horizontal power line 145 to cover the horizontal power line 145. A gate insulating film 150 is disposed on the protection film 165, and a vertical power line 140 is disposed on the gate insulating film 150. An overcoat layer 175 is disposed on the vertical power line 140.

As such, the display device according to the second embodiment of the present invention includes the protection film 165 between the gate insulating film 150 and the horizontal power line 145 on the non display area. Instead of the above-described first embodiment in which the protection film 165 is formed simultaneously with the etch stopper 160, the protection film 165 is formed by separately forming and patterning an organic material or inorganic material. Here, the protection film 165 may be formed of an inorganic material, such as a silicon oxide (SiOx) or a silicon nitride (SiNx) or an organic material, such as an acrylic resin or imide-based resin.

The protection film 165 according to the second embodiment of the present invention is formed to have a thickness enough to prevent the horizontal power line 145 from being short-circuited to the vertical power line 140 disposed on the horizontal power line 145—for example, the thickness is 2000 to 4000 Å.

As described above, the display device according to the second embodiment of the present invention includes a protection film between a horizontal power line that is a gate metal line and a vertical power line that is a data metal line, thereby preventing the gate metal line and the data metal line from contacting each other thereby causing a short circuit.

On the other hand, the above-described protection film may also be positioned in the display area according to the present invention.

Figure 9:
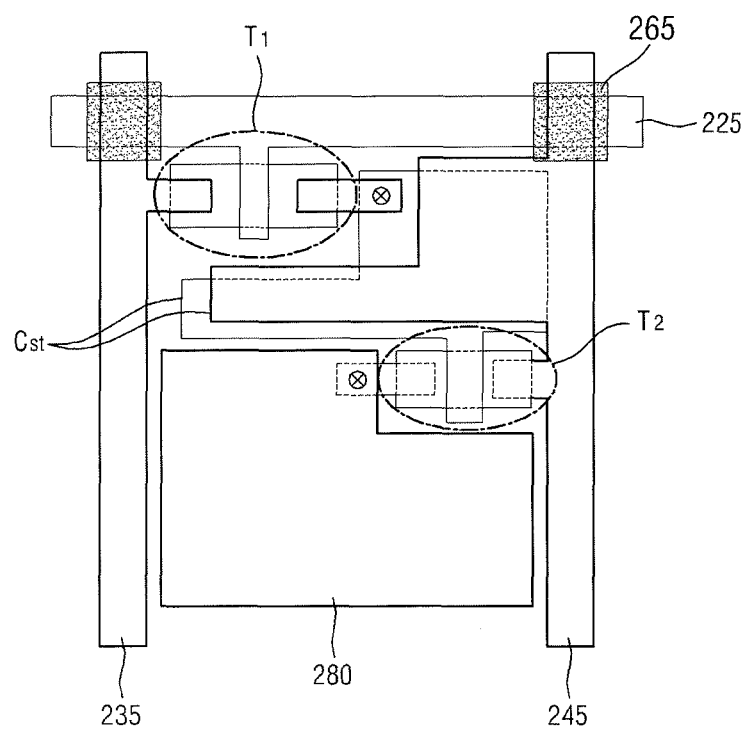
FIGS. 9 and 10 are plan views illustrating one unit pixel of a display area according to a third embodiment of the present invention.
Figure 10:
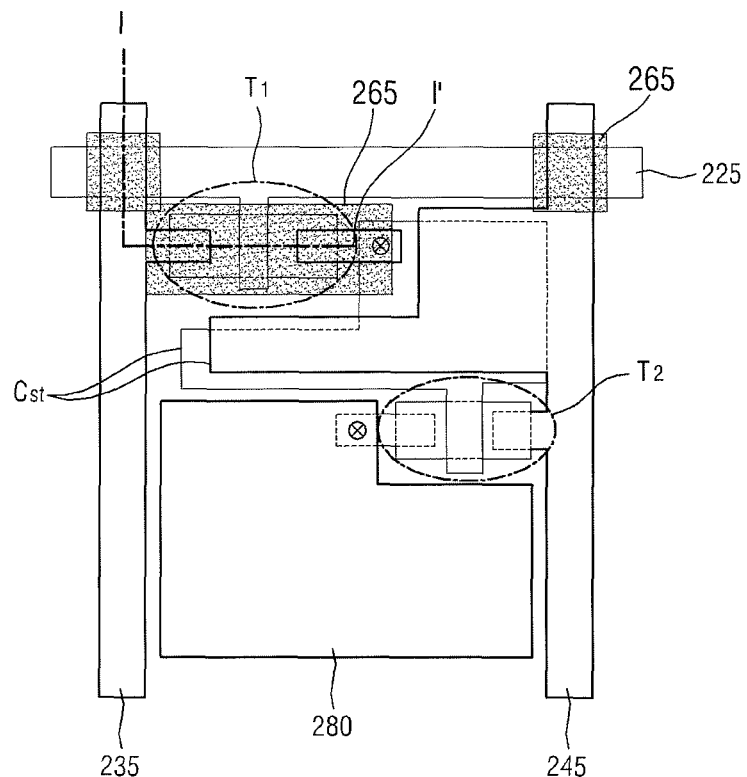
Figure 11:
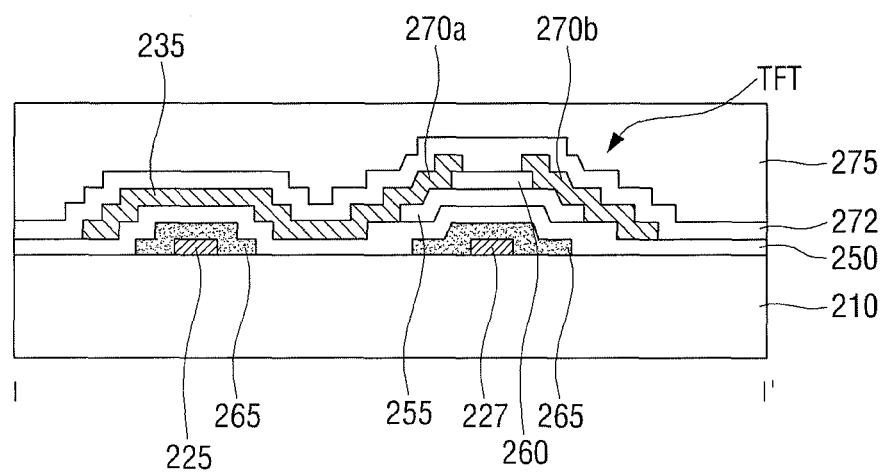
FIG. 11 is a cross-sectional view taken along line I-I' of FIG. 10.

FIGS. 9 and 10 are plan views illustrating one unit pixel of a display area according to a third embodiment of the present invention, and FIG. 11 is a cross-sectional view taken along line I-I'.

Referring to FIG. 9, a gate line 225 is arranged in a direction to apply a gate signal to a unit pixel on the substrate, and a data line 235 is arranged in a direction crossing the gate line 225 to apply a data signal. A common power line 245 is arranged in parallel with the data line 235 to apply power to the unit pixel. Here, the common power line 245 is connected to the above-described horizontal power line to thereby apply power to a pixel. The gate line 225 is formed of a gate metal material to thereby constitute a gate metal line GML, and the common power line 245 and the data line 235 are formed of the same metal material to thereby constitute a data metal line DML. Accordingly, the unit pixel includes a switching transistor T1, a driving thin film transistor T2, a capacitor Cst, a first electrode 280, a light emission layer (not shown), and a second electrode (not shown).

Meanwhile, a protection film 265 is formed between an area where the gate line 225 and the data line 235 cross and overlap each other and an area where the gate line 225 and the common power line 245 cross and overlap each other. That is, the protection film 265 prevents a gate metal line GML that is the gate line 225 and a data metal line DML that is the data line 235 from contact each other at edges thereof to thereby cause a short circuit between the gate metal line GML and the data metal line DML.

Further, as shown in FIG. 10, the protection film 265 is formed between a driving thin film transistor T2 and a switching thin film transistor T1 where a gate electrode of the gate metal line GML and source/drain electrodes of the data metal line DML are adjacent to each other.

More specifically, Referring to FIG. 11 that is a cross-sectional view taken along line I-I' of FIG. 10, in the display device 200 according to the third embodiment of the present invention, a gate electrode 227 and the gate line 225 are disposed on a substrate 210, and the protection film 265 is disposed on the gate electrode 227 and the gate line 225 to cover the gate electrode 227 and the gate line 225. The protection film 265 insulates the gate electrode 227 and the gate line 225 and covers and protects edges thereof.

A gate insulating film 250 is disposed on the protection film 265, a semiconductor layer 255 is disposed on the gate insulating film 250 at an area corresponding to the gate electrode 227, and an etch stopper 260 is disposed on the semiconductor layer 255. A source electrode 270a and a drain electrode 270b are disposed to be connected to both ends, respectively, of the semiconductor layer 255, thereby constituting a thin film transistor TFT. A data line 235 is disposed on the gate insulating film 250 corresponding to the gate line 225.

Accordingly, the protection film 265 is formed between the gate line 225 and the data line 235 and between the gate electrode 227 and the source/drain electrodes 270a and 270b. Thus, it may be possible to reduce parasitic capacitance and to prevent a short circuit from occurring between the gate line 225 and the data line 235 and between the gate electrode 227 and the source/drain electrodes 270a and 270b.

Meanwhile, a passivation film 272 is disposed to protect the thin film transistor TFT, and a color filter 273 is disposed on the passivation film 272. An overcoat layer 275 is disposed to cover the color filter 273, and a first electrode 280 is disposed on the overcoat layer 275 to be connected to the drain electrode 270b of the thin film transistor TFT through a via hole 277. A bank layer 283 is disposed on the first electrode 280 to expose part of the first electrode 280, and a light emission layer 285 is disposed on the exposed first electrode 280. A second electrode 290 is disposed on the light emission layer 285.

Figure 12:
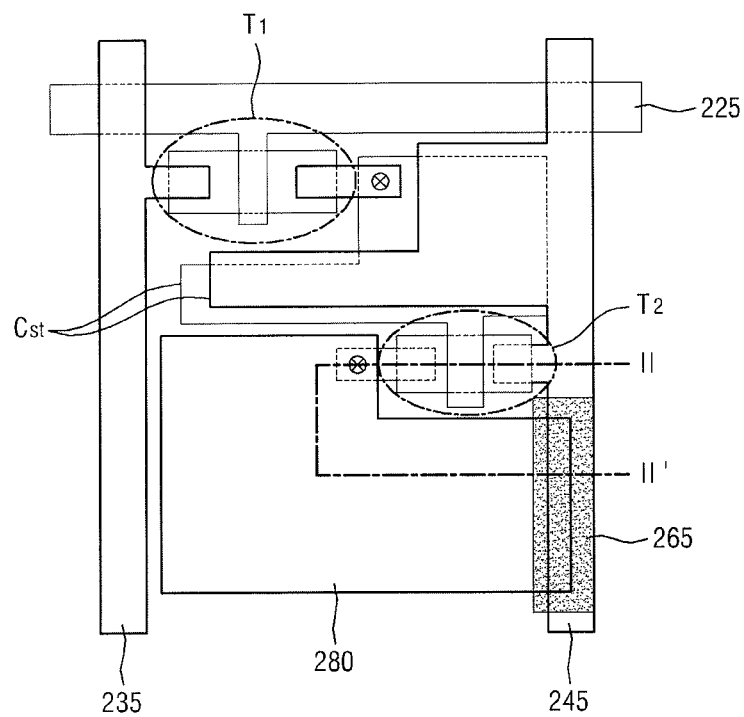
FIG. 12 is a plan view illustrating a unit pixel of a display area according to a fourth embodiment of the present invention.
Figure 13:
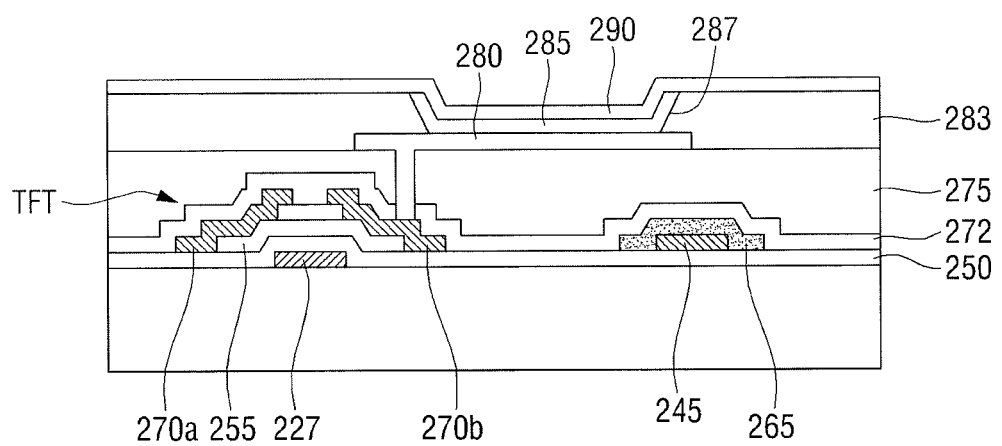
FIG. 13 is a cross-sectional view taken along line II-II' of FIG. 12.

On the other hand, the protection film according to the present invention may be formed at an area where the first electrode and data metal lines overlap each other. FIG. 12 is a plan view illustrating a unit pixel of a display area according to a fourth embodiment of the present invention, and FIG. 13 is a cross-sectional view taken along line II-II' of FIG. 13. Hereinafter, the detailed description of the same components as those described above in connection with the third embodiment is not repeated.

Referring to FIG. 12, unlike in the above-described third embodiment, the first electrode 280 is formed to overlap the common power line 245. This structure is formed due to a mask margin that occurs during a patterning process of the first electrode 280. If the first electrode 280 overlaps the common power line 245, a parasitic capacitance occurs between the first electrode 280 and the common power line 245. The present invention is not limited to the common power line 245, and may be formed so that a data line 235 that is formed of a data metal line DML overlaps the first electrode 280. That is, in the fourth embodiment of the present invention, the protection film 265 is formed between the first electrode 280 and the data metal lines. In the fourth embodiment of the present invention, an example is described in which the first electrode 280 overlaps the data line that is a data metal line 235.

More specifically, Referring to FIG. 13, in the display device 2000 according to the fourth embodiment of the present invention, a gate electrode 227 is disposed on the substrate 210, and a gate insulating film 250 is disposed on the gate electrode 227 to insulate the gate electrode 227. A semiconductor layer 255 is disposed on the gate insulating film 250 at an area corresponding to the gate electrode 227, and an etch stopper 260 is disposed on the semiconductor layer 255. A source electrode 270a and a drain electrode 270b are disposed to be connected to both ends, respectively, of the semiconductor layer 255, thereby constituting a thin film transistor TFT. Further, a protection film 265 is disposed on the gate insulating film 250 corresponding to the common power line 245 so that the protection film 265 covers the common power line 245.

A passivation film 272 is disposed on the thin film transistor TFT to protect the thin film transistor TFT, and a color filter 273 is disposed on the passivation film 272. An overcoat layer 275 is disposed to cover the color filter 273, and a first electrode 280 is disposed on the overcoat layer 275 to b connected to the drain electrode 270b of the thin film transistor TFT through a via hole 277. A bank layer 283 is disposed on the first electrode 280 to expose part of the first electrode 280, and a light emission layer 285 is disposed on the exposed first electrode 280. A second electrode 290 is disposed on the light emission layer 285.

In the fourth embodiment of the present invention, the protection film 265 is disposed between the common power line 245 and the first electrode 280. The protection film 265 may be also disposed between the data line 235 that is another data metal line and the first electrode 280. Accordingly, it may be possible to reduce parasitic capacitance and to prevent a short circuit from occurring between the data metal lines and the first electrode 280 due to overlap of the data metal lines and the first electrode 280.

Meanwhile, the protection film 265 according to the present invention may be formed anywhere except for the capacitor Cst area. Referring to FIG. 12, as in the first, second, and third embodiments of the present invention, in case the protection film 265 is positioned between the gate line (electrode) and data metal lines (data line, source/drain electrode, common power line), the protection film 265 may be formed anywhere except for the capacitor Cst area.

The capacitance of the capacitor Cst is designed based on the permittivity of the gate insulating film and thickness between the upper and lower electrodes of the capacitor. If the protection according to the present invention is formed at the capacitor, the capacitance of the capacitor may change. Thus, the protection film according to the present invention is formed on the substrate except for the capacitor Cst area.

As described above, the display device according to an embodiment of the present invention includes a protection film formed an area where the gate metal lines and data metal lines overlap each other between the gate metal lines and the data metal lines or at an area where the data metal lines and the pixel electrode overlap each other between the data metal lines and the pixel electrode, thereby reducing parasitic capacitance while preventing a short circuit from occurring therebetween.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a substrate including a display region and a non-display region;
   a plurality of pixels on the display region, each pixel comprising an organic light emitting element and a thin film transistor including an etch stopper;
   a first metal line on the substrate in the non-display region;
   a gate insulating film on the first metal line and configured to insulate the first metal line;
   a second metal line on the gate insulating film in the non-display region;
   a passivation layer on the second metal line; and
   a protection film between the first metal line and the second metal line in the non-display region, and positioned at an area where the first metal line and the second metal line overlap each other,
   wherein the protection film is formed of the same material with the etch stopper, and has a particular thickness to prevent a short between the first metal line and the second metal line.

2. The display device of claim 1, wherein the first metal line is a horizontal power line, and the second metal line is a vertical power line.

3. The display device of claim 1, wherein the first metal line is a gate electrode in the display region, and the second metal line is a source electrode and a drain electrode in the display region.

4. The display device of claim 1, wherein the protection film is disposed between the gate insulating film and the first metal line.

5. The display device of claim 1, wherein the first metal line is a gate line in the display region, and the metal line is a data line and a common power line in the display region.

6. The display device of claim 1, further comprising a capacitor disposed on the substrate in the display region, wherein the protection film is disposed at an area except for the capacitor.

7. A display device comprising:
   a substrate that includes a display area and a non-display area;
   a thin film transistor (TFT) on the display area and including a gate electrode, an active layer, an etch stopper and a source and/or drain electrode;
   an organic light emitting diode (OLED) on the display area and including an anode, an organic emitting layer and a cathode;
   a first voltage line on the non-display area along a particular direction of the substrate;
   a second voltage line on the non-display area to intersect with the first voltage line and including parts overlapped with the first voltage line; and
   a short preventing layer at overlapping parts between the first voltage line and the second voltage line,
   wherein the short preventing layer is formed of the same material with the etch stopper, and has a particular thickness to prevent a short between the first voltage line and the second voltage line.

8. The display device of claim 7, wherein one of the first voltage line and the second voltage line is of the same material as that of the gate electrode and the other is of the same material as that of the source and/or drain electrode.

9. The display device of claim 7, further comprising an insulating layer on the short preventing layer and providing electrical insulation between the first voltage line and the second voltage line.

10. The display device of claim 7, further comprising:
    a scanning line on the display area and electrically connected with the gate electrode;
    a data line on the display area to intersect with the scanning line and electrically connected with one of the source and/or drain electrode; and
    a common voltage line on the display area to intersect with the scanning line and electrically connected with the cathode.

11. The display device of claim 10, wherein the scanning line is of different material than that of the data line, while the common voltage line and the data line is of the same material as that of the source and/or drain electrode.

12. The display device of claim 7, further comprising a first interlayer at intersection parts between the scanning line and one of the data line and the common voltage line to electrically insulate the scanning line from one of the data line and the common voltage line.

13. The display device of claim 7, further comprising a second interlayer at intersection parts between the gate electrode and the source and/or drain electrode.

14. The display device of claim 7, wherein the anode includes an overlapped area with one of the common voltage line and the data line.

15. The display device of claim 7, further comprising a third interlayer on the overlapped area, wherein the third interlayer includes an inorganic material, such as a silicon oxide (SiOx) or a silicon nitride (SiNx), or an organic material, such as an acrylic resin or imide-based resin.

16. The display device of claim 7, wherein a first interlayer, a second interlayer and a third interlayer at intersection parts are formed of the same material with the etch stopper.

17. The display device of claim 7, wherein the particular thickness is 2000 Å to 4000 Å.

* * * * *